United States Patent
Chen

(10) Patent No.: US 12,513,971 B2
(45) Date of Patent: Dec. 30, 2025

(54) METHOD FOR MAKING ELEVATED SOURCE-DRAIN STRUCTURE OF PMOS IN FDSOI PROCESS

(71) Applicant: Shanghai Huali Integrated Circuit Corporation, Shanghai (CN)

(72) Inventor: Yongyue Chen, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 496 days.

(21) Appl. No.: 18/181,784

(22) Filed: Mar. 10, 2023

(65) Prior Publication Data
US 2024/0030071 A1   Jan. 25, 2024

(30) Foreign Application Priority Data

Jul. 20, 2022   (CN) .......................... 202210862830.X

(51) Int. Cl.
| H10D 84/01 | (2025.01) |
| H01L 21/02 | (2006.01) |
| H10D 30/69 | (2025.01) |
| H10D 84/03 | (2025.01) |

(52) U.S. Cl.
CPC ..... *H10D 84/017* (2025.01); *H01L 21/02236* (2013.01); *H10D 30/797* (2025.01); *H10D 84/0167* (2025.01); *H10D 84/038* (2025.01)

(58) Field of Classification Search
CPC .. H10D 30/797; H10D 84/017; H10D 84/038; H10D 30/6713; H10D 64/259; H10D 86/421; H01L 21/22; H01L 21/02236
See application file for complete search history.

(56) References Cited

U.S. PATENT DOCUMENTS

| 9,064,893 | B2* | 6/2015 | Liao | ..................... H10D 30/024 |
| 10,879,354 | B2* | 12/2020 | Wu | ..................... H10D 84/0193 |
| 2011/0068396 | A1* | 3/2011 | Cheng | ................. H10D 62/822 |
| | | | | 257/E29.256 |
| 2022/0109045 | A1* | 4/2022 | Gu | ....................... H10D 86/201 |

OTHER PUBLICATIONS

Labrot, Maxime, et al. "Improvement of boron doping in SiGe raised sources and drains for FD-SOI technology by carbon incorporation." ECS Transactions 75.8 (2016): 29. (Year: 2016).*

* cited by examiner

*Primary Examiner* — Jacob Y Choi
*Assistant Examiner* — Aaron Michael Wegner
(74) *Attorney, Agent, or Firm* — Banner & Witcoff, Ltd.

(57) ABSTRACT

This application discloses a method for making an elevated source-drain structure of a PMOS in an FDSOI process, including: Step 1, forming a gate structure of a PMOS on an FDSOI substrate; Step 2, forming an elevated source-drain structure, further including: Step 21, forming a seed layer; Step 22, forming a bulk layer, the bulk layer being a B—Ge-doped Si epitaxial layer. Step 23, forming a first cap layer and a second cap layer in sequence, the first cap layer being a B-doped Si epitaxial layer, the second cap layer being a Si epitaxial layer; Step 24, performing a thermal oxidation process to form a top oxide layer and diffuse B impurities from the first cap layer into the bulk layer, the seed layer and the bottom semiconductor substrate; Step 25, removing the top oxide layer; and Step 26, forming a third cap layer.

15 Claims, 7 Drawing Sheets

METHOD FOR MAKING ELEVATED SOURCE-DRAIN STRUCTURE OF PMOS IN FDSOI PROCESS

CROSS-REFERENCES TO RELATED APPLICATIONS

This application claims the priority to Chinese patent application No. CN 202210862830.X, filed on Jul. 20, 2022, and entitled "METHOD FOR MAKING ELEVATED SOURCE-DRAIN STRUCTURE OF PMOS IN FDSOI PROCESS", the disclosure of which is incorporated herein by reference in entirety.

TECHNICAL FIELD

This application relates to a method for making a semiconductor integrated circuit, and in particular, to a method for making an elevated source-drain structure of a PMOS device in a fully depleted silicon-on-insulator (FDSOI) process.

BACKGROUND

Stressed channel transistors have been widely studied in the field of manufacturing semiconductor integrated circuitry. Applying elevated SiGe technology in the FDSOI can further improve the carrier mobility of a PMOS channel, thereby improving the performance of the device and further reducing the transistor size to achieve a larger scale of integration.

The FDSOI process involves adopting an elevated silicon germanium (SiGe) source-drain structure, the technique of growing an epitaxial layer includes the following method: first growing a low Ge (germanium)-B (boron) doped seed layer on a substrate by an epitaxial process which reduces lattice mismatch between the epitaxial layer and the substrate; then, growing a bulk layer with higher doping concentrations of Ge and B than the seed layer by another epitaxial process, so that the distribution of the channel stress field and the source-drain current field can be controlled simultaneously through the concentrations of Ge and B in the bulk layer; and finally, doping Si—B epitaxially, that is, doping B and Si, as a cap layer, and carrying out nickel and platinum (NiPt) deposition and annealing to form a NiSi layer. However, in the epitaxial growth process of the bulk layer, increasing $GeH_4$ flow rate limits the reaction between $B_2H_6$ and the substrate, thereby limiting B concentration increase in the epitaxial layer. Thus, it is difficult to achieve high concentrations of Ge and B simultaneously, ultimately affecting the device from meeting the requirements of high mobility and low electric resistance at the same time.

The existing method will be described in more detail below in conjunction with the accompanying drawings. Referring to FIGS. 1A-1D, they are schematic diagrams of a device structure in each step of the method for making an elevated source-drain structure of a PMOS in the existing FDSOI process. The method for making an elevated source-drain structure of a PMOS in an existing FDSOI process includes the following steps.

In Step 1, referring to FIG. 1A, an FDSOI substrate is provided and a gate structure of a PMOS device is formed on the FDSOI substrate. The FDSOI substrate includes a bottom semiconductor substrate 101, a buried insulating dielectric layer 102 and a top semiconductor substrate 103.

The buried insulating dielectric layer 102 is located between the bottom semiconductor substrate 101 and the top semiconductor substrate 103.

A channel region is formed under the gate structure on the top semiconductor substrate 103.

Generally, the gate structure includes a gate dielectric layer 104, a gate conductive material layer 105, and sidewalls 106 further formed on sides of the gate structure.

The sidewalls 106 are made from a material which includes silicon oxide or silicon nitride.

A hard mask layer is further formed at top of the gate structure, and the hard mask layer is made from a material which includes silicon oxide or silicon nitride.

In Step 2, an elevated source-drain structure 107 is formed at two sides of the gate structure in a self-aligning way. The method in Step 2 includes the following sub-steps.

In Step 2.1, referring to FIG. 1B, epitaxial growth is performed to form a seed layer 107a on surfaces of the top semiconductor substrate 103 at two sides of the gate structure.

Usually, the seed layer 107a is a B—Ge-doped Si epitaxial layer, the seed layer 107a has a boron (B) doping concentration which is lower than that of the bulk layer 107b (FIG. 1C), the seed layer 107a has a germanium (Ge) doping concentration which is lower than that of the bulk layer 107b, and the seed layer 107a functions as an interface to match lattice structures between the top semiconductor substrate 103 and the bulk layer 107b so as to reduce the lattice mismatch defects.

In Step 2.2, referring to FIG. 1C, an epitaxial growth is performed to form the bulk layer 107b on the surface of the seed layer 107a. The bulk layer 107b is also a B—Ge-doped Si epitaxial layer. However, the Ge doping of the bulk layer 107b increases the stress of the channel region, therefore improves the carrier mobility of the channel region, such that in a proper range the higher the Ge doping concentration of the bulk layer 107b is, the greater the stress in the channel region will be. The B doping of the bulk layer 107b reduces source-drain electric resistance, and the higher the B doping concentration is, the lower the source-drain electric resistance can be.

Usually, during the epitaxial growth process of the bulk layer 107b, a Ge source gas $GeH_4$ and a B source gas $B_2H_6$ are applied. Desired B doping is challenged because increasing the flow rate of $GeH_4$ for faster reaction will limit the reaction rate between $B_2H_6$ and the substrate, thereby inhibiting the increase of B doping concentration. Therefore, during the epitaxial growth process of the bulk layer 107b, increasing Ge doping concentration will inhibit increasing B doping concentration. In this way, high Ge doping concentration in the bulk layer 107b results in reduced B doping concentration. Vice versa increasing the B doping concentration leads to reduced Ge doping concentration. Therefore, with the existing method, the Ge doping concentration and the B doping concentration in the bulk layer 107b cannot meet the requirement at the same time.

In Step 2.3, referring to FIG. 1D, epitaxial growth is performed to form a cap layer 107c on the surface of the bulk layer 107b, and the cap layer 107c is a B-doped Si epitaxial layer. The seed layer 107a, the bulk layer 107b and the cap layer 107c are stacked together to form the elevated source-drain structure 107.

Usually, the method further includes: forming a metal silicide layer on the surface of the cap layer 107c.

The metal silicide includes nickel silicide (NiSi). NiSi is usually formed by depositing NiPt followed by an annealing process.

BRIEF SUMMARY

According to some embodiments of this disclosure, a method for making an elevated source-drain structure of a PMOS in the FDSOI process includes the following steps:

Step 1, providing an FDSOI substrate and forming a gate structure of a PMOS device on the FDSOI substrate, wherein the FDSOI substrate includes a bottom semiconductor substrate, a buried insulating dielectric layer and a top semiconductor substrate, wherein the buried insulating dielectric layer is disposed between the bottom semiconductor substrate and the top semiconductor substrate;

a channel region is formed on the top semiconductor substrate 103 under the gate structure; and Step 2, forming an elevated source-drain structure at two sides of the gate structure in a self-aligning way, wherein the method in Step 2 includes the following sub-steps:

Step 2.1, performing epitaxial growth to form a seed layer on surfaces of the top semiconductor substrate at two sides of the gate structure;

Step 2.2, performing an epitaxial growth to form a bulk layer on the surface of the seed layer, wherein the bulk layer is a B—Ge-doped Si epitaxial layer, the Ge doping of the bulk layer is used to increase the stress of the channel region so to improve the carrier mobility of the channel region, in this process the higher the Ge doping concentration of the bulk layer 107b is, the greater the stress of the channel region can be; during the epitaxial growth process of the bulk layer, increasing of the Ge doping concentration of the bulk layer inhibits the increase of the B doping concentration;

Step 2.3, performing epitaxial growth to form a first cap layer and a second cap layer in sequence on a surface of the bulk layer, wherein the first cap layer is a B-doped Si epitaxial layer and the second cap layer is a Si epitaxial layer;

the first cap layer has a B doping concentration greater than that of the bulk layer, and B impurities in the first cap layer serve as a B source for increasing the B doping concentration of the underneath bulk layer.

Step 2.4, performing a thermal oxidation process, wherein the thermal oxidation process is performed to oxidize both the second cap layer and the first cap layer, but it merely oxidize some thickness at the top of the bulk layer or it does not oxidize the bulk layer at all; during the thermal oxidation process, the top oxide layer formed by the thermal oxidation process contains silicon dioxide with a characteristics that the bonding strength of the Si—O bond is stronger than bonding strength of the Ge—O bond;

by configuring the top oxide layer as the top confinement layer and the buried insulating dielectric layer as the bottom confinement layer, the B impurities diffuse from the first cap layer into the bulk layer, the seed layer and the top semiconductor substrate during the thermal oxidation process, thus increases the B doping concentrations of the bulk layer, the seed layer and the top semiconductor substrate, thereby reducing the source-drain electric resistance;

Step 2.5, removing the top oxide layer; and

Step 2.6, performing an epitaxial growth to form a third cap layer on the surface of the bulk layer, wherein the third cap layer is a B-doped Si epitaxial layer; stacking the seed layer, the bulk layer and the third cap layer to form the elevated source-drain structure.

In some cases, when the bulk layer is oxidized at its top with an oxide thickness in Step 2.4, to compensate for the oxide thickness out of the bulk layer, Step 2.2 may be configured to have an additional thickness, such that the additional thickness may compensate for the depleted thickness of the bulk layer from its oxidation in Step 2.4.

In some cases, in Step 2.4, the thermal oxidation process also diffuses B impurities and Ge impurities from the oxidized region of the bulk layer to the unoxidized region of the bulk layer at the bottom, the seed layer and the top semiconductor substrate, so that the B doping concentration and the Ge doping concentration in the unoxidized region of the bulk layer, the seed layer and the top semiconductor substrate are all increased.

In some cases, the Ge concentration of the bulk layer is configured to be within a range of 20% to 45%.

In some cases, the first cap layer has a thickness in the range of 100 Å-200 Å and the B doping concentration is in the range of $2e^{20}cm^{-3}$-$1e^{21}cm^{-3}$.

In some cases, the second cap layer has a thickness in the range of 100 Å-200 Å.

In some cases, the third cap layer has a thickness in the range of 100 Å-200 Å and the B doping concentration of $2e^{20}cm^{-3}$-$1e^{21}cm^{-3}$.

In some cases, in Step 2.1, the seed layer is a B—Ge-doped Si epitaxial layer, the seed layer has a B doping concentration lower than that of the bulk layer, the seed layer has a Ge doping concentration lower than that of the bulk layer, and the seed layer reduces defects generated from the lattice mismatch between the top semiconductor substrate and the bulk layer.

In some cases, in Step 2.2, during the epitaxial growth process of the bulk layer, the Ge source gas includes GeH4, and the B source gas includes B2H6; increasing the flow rate of GeH4 will limit the reaction between B2H6 and the substrate, thereby inhibiting the increase of B doping concentration.

In some cases, in Step 1, the bottom semiconductor substrate is made of a material including silicon, the buried insulating dielectric layer is made of a material including silicon dioxide, and the top semiconductor substrate is made of a material including silicon.

In some cases, in Step 2.4, the thermal oxidation process is dry-oxygen oxidation.

In some cases, in Step 2.5, a SiCoNi cleaning process is performed to remove the top oxide layer.

In some cases, the method further includes: forming a metal silicide on a surface of the third cap layer.

In some cases, the metal silicide includes NiSi.

In some cases, in Step 1, the gate structure includes a gate dielectric layer 104 and a gate conductive material layer 105, and sidewalls are further formed on sides of the gate structure.

According to this disclosure, after the bulk layer of the elevated source-drain structure is formed, the step of forming the first cap layer and the second cap layer is added. Unlike the bulk layer which is a B—Ge-doped Si epitaxial layer, the first cap layer is a B-doped Si epitaxial layer. Since the B-doped Si epitaxial layer does not contain Ge, the B doping concentration of the B-doped Si epitaxial layer will not be limited, B with a high doping concentration can be formed in the first cap layer so the first cap layer serves as a B source for increasing B doping in the bulk layer. Moreover, according to this application, the second cap layer is a Si epitaxial layer which will be first oxidized to form silicon dioxide in the subsequent thermal oxidation process. The top oxide layer formed by the thermal oxidation process may combine with the buried insulating dielectric layer of the FDSOI substrate to form top and bottom confinement layers for the diffusion of B and Ge impurities, so that B in the first cap layer can diffuse into the bulk layer at the bottom, the seed layer and the bottom semiconductor substrate, thus eventually increasing the B doping concentration of the elevated source-drain structure. According to this embodiment, the increase of the B doping concentration of the elevated source-drain structure is not limited by the Ge doping concentration of the bulk layer, the Ge doping concentration of the bulk layer can be set to a high concentration as desired. In this way, this application can eliminate the limitation of the Ge doping concentration of the elevated source-drain structure on the B doping concentration, thereby it is possible to simultaneously increase the Ge doping concentration and the B doping concentration in the elevated source-drain structure so that the device meets the requirements of high mobility and low electric resistance at the same time.

According to this embodiment, in addition to formation of the first cap layer and the second cap layer, the thickness of the bulk layer during epitaxial growth can be further increased and the top of the bulk layer is oxidized to some thickness in the thermal oxidation process. Ge and B impurities in the oxidized region of the bulk layer will further diffuse downwards to increase the Ge doping concentration and the B doping concentration in the elevated source-drain structure, thereby further improving the performance of the device.

BRIEF DESCRIPTION OF THE DRAWINGS

This application will be further described in detail with reference to the accompanying drawings and specific embodiments.

DETAILED DESCRIPTION OF THE DISCLOSURE

Figure 1A:
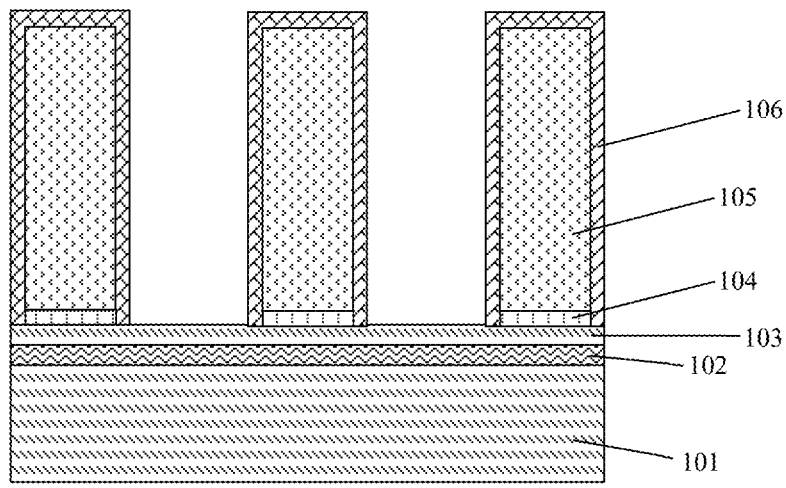
FIGS. 1A-1D are schematic diagrams of a device structure in each step of a method for making an elevated source-drain structure of a PMOS device in an existing FDSOI process.
Figure 1B:
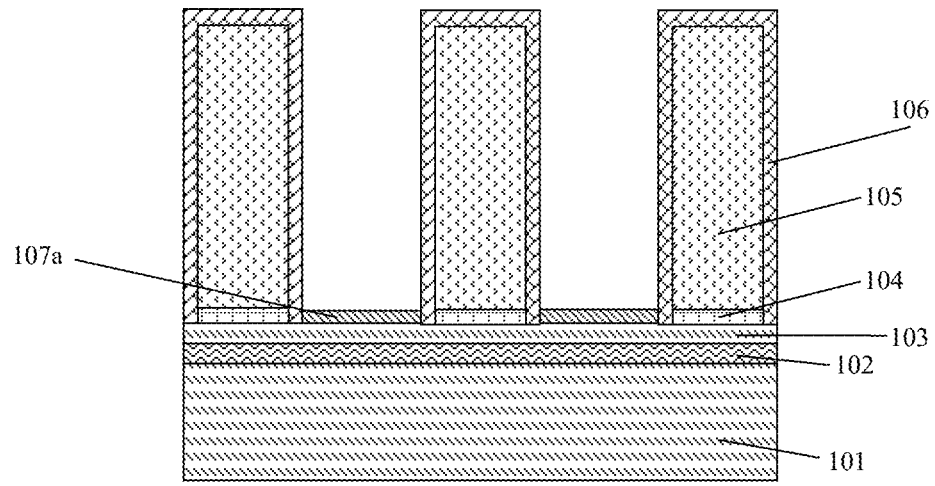
Figure 1C:
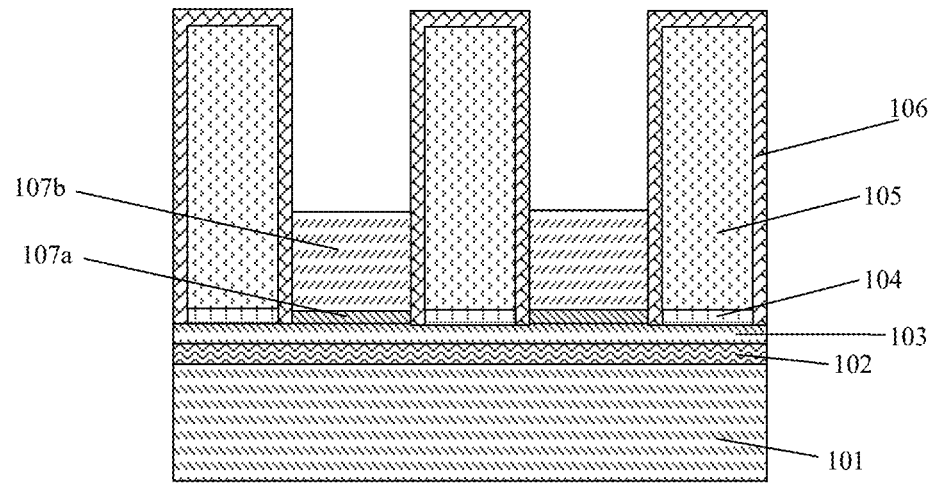
Figure 1D:
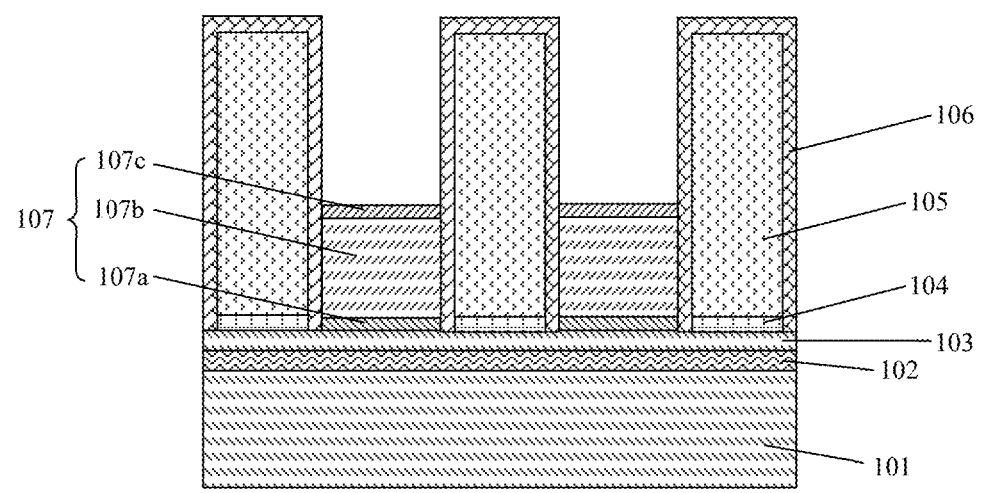
Figure 2:
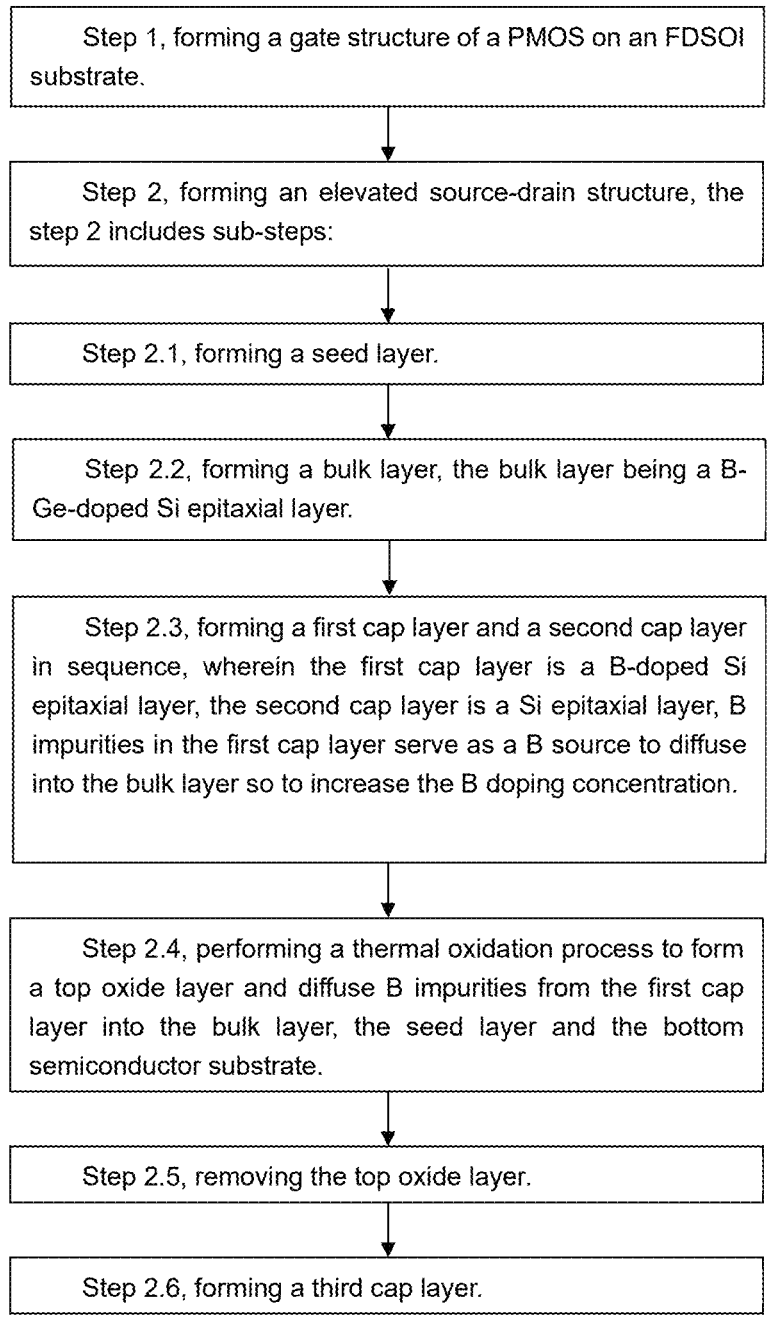
FIG. 2 is a flowchart of a method for making an elevated source-drain structure of a PMOS device in an FDSOI process according to an embodiment of this disclosure.

Referring to FIG. 2, it shows the flowchart of the method for making an elevated source-drain structure 207 of a PMOS device in the FDSOI process according to an embodiment of this disclosure. Referring to FIGS. 3A-3G, which show schematic diagrams of the device structure in each major step of the method for making an elevated source-drain structure of the PMOS in the FDSOI process according to an embodiment of this disclosure. The method for making an elevated source-drain structure 207 of the PMOS in the FDSOI process according to the embodiment of this disclosure includes the following steps.

Figure 3A:
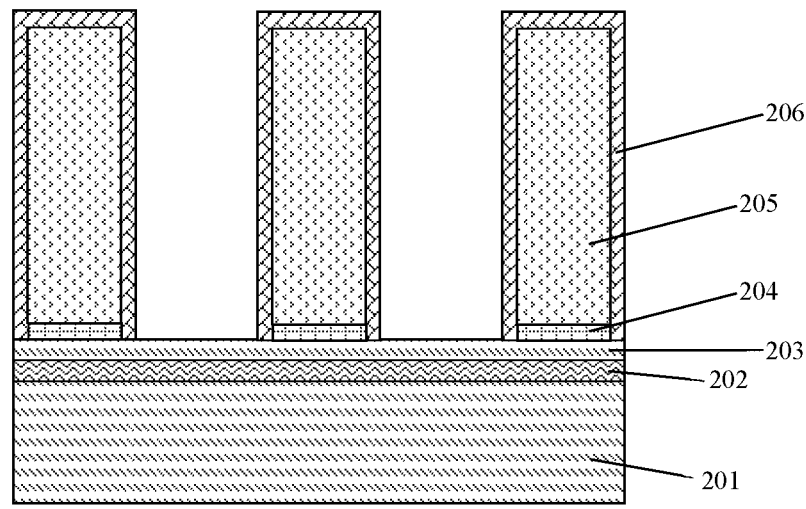
FIGS. 3A-3G are schematic diagrams of a device structure in each step of the method for making an elevated source-drain structure of a PMOS device in the FDSOI process according to an embodiment of this disclosure.

In Step 1, as shown in FIG. 3A, an FDSOI substrate is provided and a gate structure of a PMOS is formed on the FDSOI substrate. The FDSOI substrate includes a bottom semiconductor substrate 201, a buried insulating dielectric layer 202 and a top semiconductor substrate 203, and the buried insulating dielectric layer 202 is located between the bottom semiconductor substrate 201 and the top semiconductor substrate 203.

A channel region is formed on the top semiconductor substrate 203 under the gate structure.

In the embodiment of this application, the gate structure includes a gate dielectric layer 204 and a gate conductive material layer 205, and sidewalls 206 are further formed on sides of the gate structure.

In some embodiments, the gate dielectric layer 204 adopts a gate oxide layer, and the gate conductive material layer 205 adopts a polysilicon gate. In some other embodiments, the gate dielectric layer 204 adopts a high-dielectric-constant layer, and the gate conductive material layer 205 adopts a metal gate.

The sidewalls 206 are made of a material including silicon oxide or silicon nitride.

A hard mask layer is further formed at a top of the gate structure, and the hard mask layer is made of a material including silicon oxide or silicon nitride.

In some embodiments, the bottom semiconductor substrate 201 is made of a material including silicon, the buried insulating dielectric layer 202 is made of a material including silicon dioxide, and the top semiconductor substrate 203 is made of a material including silicon.

In Step 2, the elevated source-drain structure 207 is formed at two sides of the gate structure in a self-aligning way. The method in Step 2 includes the following sub-steps.

Figure 3B:
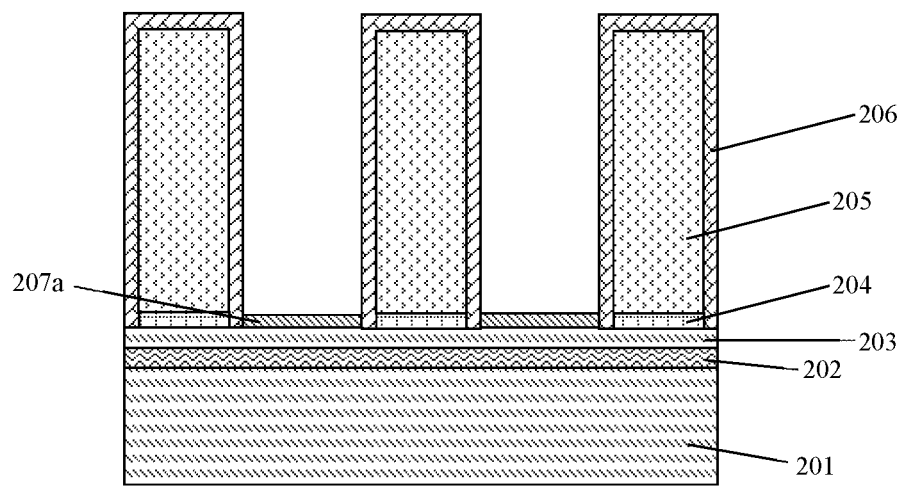

In Step 2.1, referring to FIG. 3B, epitaxial growth is performed to form a seed layer 207a on surfaces of the top semiconductor substrate 203 at two sides of the gate structure.

In the embodiment of this application, the seed layer 207a is a B—Ge-doped Si epitaxial layer, the seed layer 207a has a B doping concentration lower than the B doping concentration of a bulk layer 207b, the seed layer 207a has a Ge doping concentration lower than the Ge doping concentration of the bulk layer 207b, and the seed layer 207a reduces defects from the lattice mismatch between the top semiconductor substrate 203 and the bulk layer 207b.

Figure 3C:
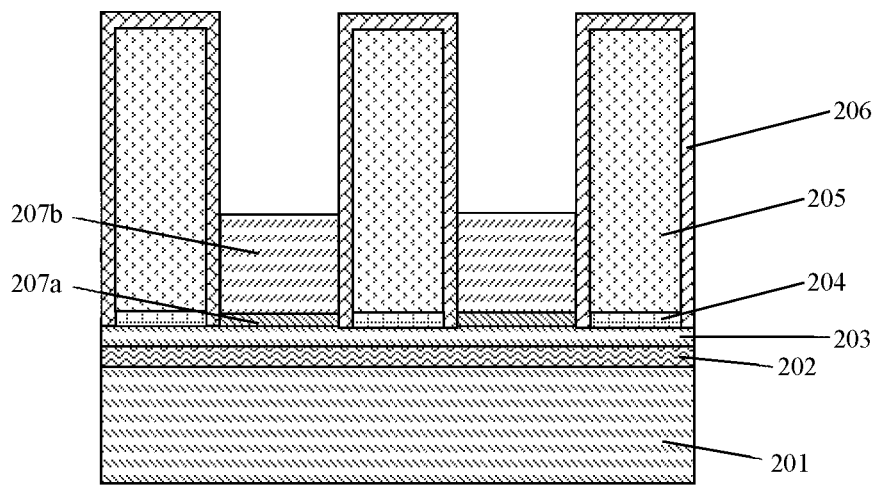

In Step 2.2, referring to FIG. 3C, epitaxial growth is performed to form the bulk layer 207b on the surface of the seed layer 207a. The bulk layer 207b is a B—Ge-doped Si epitaxial layer. The Ge doping of the bulk layer 207b is used to increase the stress of the channel region and improve the carrier mobility of the channel region, and the higher the Ge doping concentration of the bulk layer 207b is, the greater the stress of the channel region can be. During the epitaxial growth process of the bulk layer 207b, increasing the Ge doping concentration of the bulk layer 207b will inhibit increasing the B doping concentration.

In the embodiment of this application, during the epitaxial growth process of the bulk layer 207b, a Ge source gas includes $GeH_4$, and a B source gas includes $B_2H_6$. Increasing the flow rate of $GeH_4$ will limit the reaction between $B_2H_6$ and the substrate, thereby inhibiting the increase of the B doping concentration. The Ge concentration during the epitaxial growth of the bulk layer 207b is set in general for the benefit of improving the stress of the channel region, often neglecting the consequence in limiting the B doping concentration. In some preferred embodiments, the Ge concentration of the bulk layer 207b is configured to be within a range of 20% to 45%.

Figure 3D:
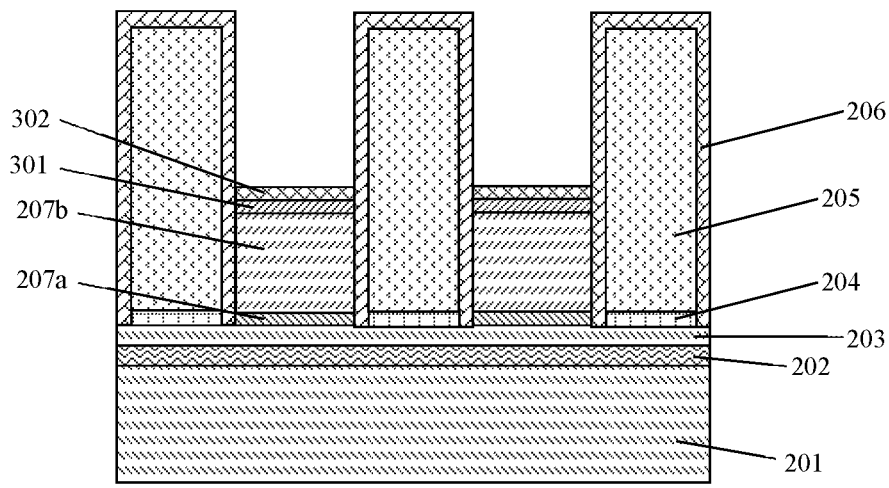

In Step 2.3, referring to FIG. 3D, epitaxial growth is performed to form a first cap layer 301 first and a second cap layer 302 after in sequence on a surface of the bulk layer.

The first cap layer 301 is a B-doped Si epitaxial layer and the second cap layer 302 is a Si epitaxial layer.

The first cap layer 301 has a B doping concentration greater than that of the bulk layer 207b, and B impurities in the first cap layer 301 serve as a B source for increasing the B doping concentration of the bulk layer 207b.

In some preferred embodiments, the first cap layer 301 has a thickness in the range of 100 Å-200 Å and a B doping concentration of 2e20cm−3-1e21cm−3.

The second cap layer 302 has a thickness in the range of 100 Å-200 Å.

In Step 2.4, a thermal oxidation process is performed.

The thermal oxidation process is performed to oxidize both the second cap layer 302 and the first cap layer 301, and the bulk layer 207b is not oxidized or the bulk layer is oxidized to some thickness at the top.

Figure 3E:
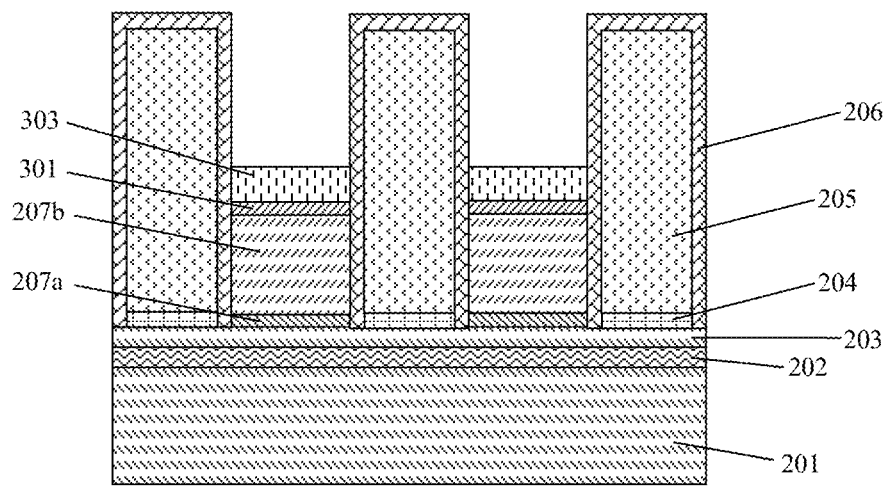

Referring to FIG. 3E, the second cap layer 302 is first oxidized to form the top oxide layer 303.

Figure 3F:
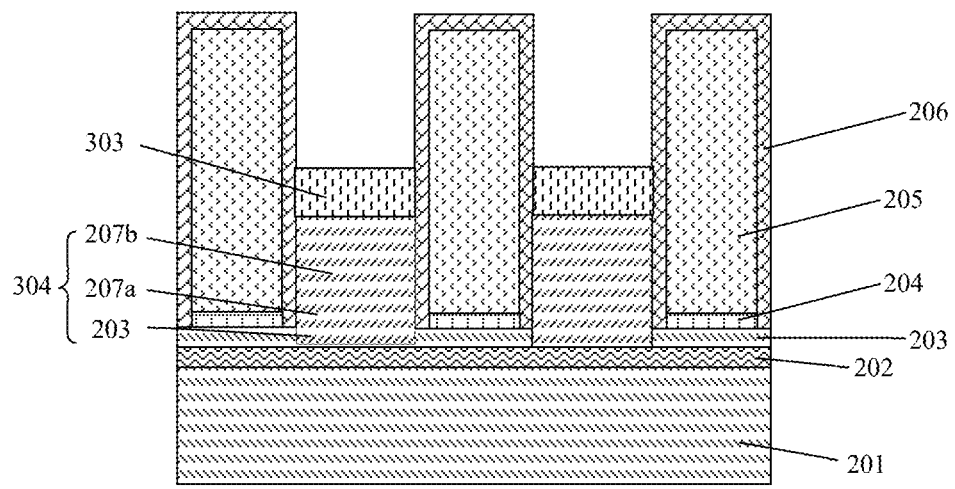

Referring to FIG. 3F, the first cap layer 301 is then oxidized to merge with the top oxide layer 303 layer, so that the top oxide layer 303 grows thicker. In some embodiments, the bulk layer 207b is also oxidized to some thickness at its top to merge into the top oxide layer 303, so that the top oxide layer 303 grows thicker further.

In the thermal oxidation process, the top oxide layer 303 formed by the thermal oxidation process is made of silicon dioxide with a characteristic that the bonding strength of Si—O bond is stronger than the bonding strength of Ge—O bond.

The top oxide layer 303 is a top confinement layer and the buried insulating dielectric layer 202 is a bottom confinement layer, because the B diffusion rate in the top oxide layer and the buried insulating dielectric layer is much slower, the thermal oxidation process also diffuses the B impurities from the first cap layer 301 into the bulk layer 207b, the seed layer 207a and the top semiconductor substrate 203, such that the B doping concentrations in the bulk layer 207b, the seed layer 207a and the top semiconductor substrate 203 can be increased, thereby reducing the source-drain electric resistance.

Referring to FIG. 3F, a stacked structure of the bulk layer 207b, the seed layer 207a and the top semiconductor substrate 203 between the top oxide layer 303 and the buried insulating dielectric layer 202 is referred to as the numeral 304.

In the embodiment of this application, when the bulk layer 207b is oxidized to some thickness at the top, the thickness of the bulk layer 207b is increased by an additional thickness in Step 2.2 to compensate the depleted thickness in the bulk layer due to oxidation in Step 2.4.

In Step 2.4, the heat in the thermal oxidation process also diffuses B impurities and Ge impurities from the oxidized region of the bulk layer 207b to the unoxidized region of the bulk layer 207b at the bottom, the seed layer 207a and the top semiconductor substrate 203, so that the B doping concentration and the Ge doping concentration of the unoxidized region in the bulk layer 207b, the seed layer 207a and the top semiconductor substrate 203 are all increased.

In some embodiments, the thermal oxidation process is dry-oxygen oxidation.

Figure 3G:
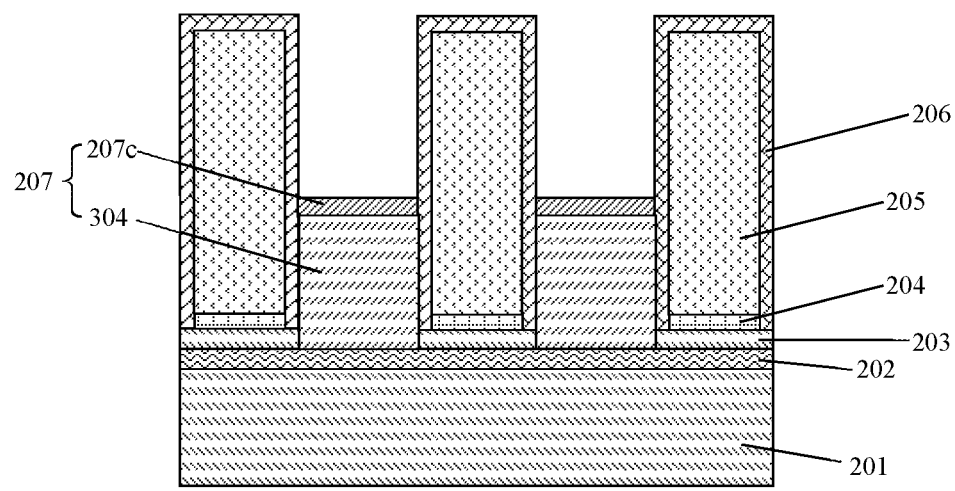

In Step 2.5, referring to FIG. 3G, the top oxide layer 303 is removed.

In some embodiments, a SiCoNi cleaning process is performed to remove the top oxide layer 303.

In Step 2.6, referring to FIG. 3G, epitaxial growth is performed to form a third cap layer 207c on the surface of the bulk layer 207b, and the third cap layer 207c is a B-doped Si epitaxial layer. The top semiconductor substrate 203, the seed layer 207a, the bulk layer 207b and the third cap layer 207c are stacked to form the elevated source-drain structure 207.

In the embodiment of this application, the method further includes: forming a metal silicide on a surface of the third cap layer 207c.

The metal silicide includes NiSi. NiSi is usually formed by NiPt deposition and annealing process.

In some preferred embodiments, the third cap layer 207c has a thickness in the range of 100 Å-200 Å and a B doping concentration of $2e^{20}cm^{-3}$-$1e^{21}cm^{-3}$. The high B doping concentration of the third cap layer 207c is beneficial to the formation of the metal silicide.

According to the embodiment of this disclosure, after the bulk layer 207b of the elevated source-drain structure 207 is formed, the step of forming the first cap layer 301 and the second cap layer 302 is added. Unlike the bulk layer 207b which is a B—Ge-doped Si epitaxial layer, the first cap layer 301 is a B-doped Si epitaxial layer. Since the B-doped Si epitaxial layer does not contain Ge, the B doping concentration of the B-doped Si epitaxial layer will not be limited by the GeH₄ gas flow rate, so B with a high doping concentration can be formed in the first cap layer 301 which then serves as a B source for increasing B doping in the bulk layer 207b. Moreover, according to the embodiment of this disclosure, the second cap layer 302 is a Si epitaxial layer which will be first oxidized to form silicon dioxide in the subsequent thermal oxidation process. The top oxide layer 303 formed by the thermal oxidation process can combine with the buried insulating dielectric layer 202 of the FDSOI substrate to form top and bottom confinement layers for the diffusion of B and Ge impurities, so that B in the first cap layer 301 can diffuse into the bulk layer 207b at the bottom, the seed layer 207a and the bottom semiconductor substrate 201, thus increasing the B doping concentration of the elevated source-drain structure 207. According to the embodiment of this disclosure, since the increase of the B doping concentration of the elevated source-drain structure 207 is not limited by the Ge doping concentration of the bulk layer 207b, the Ge doping concentration of the bulk layer 207b can be set to a high concentration as required. In this way, the embodiment of this application can eliminate the limitation of the Ge doping concentration of the elevated source-drain structure 207 on the B doping concentration, thereby simultaneously increasing the Ge doping concentration and the B doping concentration of the elevated source-drain structure 207 so that the device provides high mobility and low electric resistance at the same time.

According to the embodiment of this disclosure, in addition to formation of the first cap layer 301 and the second cap layer 302, the thickness of the bulk layer 207b during epitaxial growth can be further increased and the bulk layer 207b is oxidized to some thickness at the top in the thermal oxidation process. Ge and B impurities in the oxidized region of the bulk layer 207b will further diffuse downwards to further increase the Ge doping concentration and the B doping concentration in the elevated source-drain structure 207, thereby further improving the performance of the device.

This disclosure has been described in detail through specific embodiments above, but these do not constitute a limitation on this invention. Without departing from the principle of this disclosure, those skilled in the art can also make modifications and improvements, which should also be regarded as falling within the scope of this invention.

What is claimed is:

1. A method for making an elevated source-drain structure of a PMOS device in an FDSOI process, comprising:
Step 1, providing an FDSOI substrate and forming a gate structure of the PMOS device on the FDSOI substrate, wherein the FDSOI substrate comprises a bottom semiconductor substrate, a buried insulating dielectric layer, and a top semiconductor substrate, wherein the buried insulating dielectric layer is disposed between the bottom semiconductor substrate and the top semiconductor substrate;

forming a channel region on the top semiconductor substrate under the gate structure; and Step 2, forming an elevated source-drain structure at two sides of the gate structure in a self-aligning way, wherein Step 2 further comprises:

Step 2.1, performing an epitaxial growth to form a seed layer on surfaces of the top semiconductor substrate at the two sides of the gate structure;

Step 2.2, performing epitaxial growth to form a bulk layer on a surface of the seed layer, wherein the bulk layer is a B—Ge-doped Si epitaxial layer, wherein an increase of a Ge doping concentration of the bulk layer inhibits an increase of a B doping concentration during the epitaxial growth;

Step 2.3, performing an epitaxial growth to form a first cap layer on a surface of the bulk layer and a second cap layer on the first cap layer, wherein the first cap layer is a B-doped Si epitaxial layer and the second cap layer is a Si epitaxial layer, wherein a B doping concentration in the first cap layer is larger than a B doping concentration in the bulk layer, wherein B impurities in the first cap layer serve as a B source to diffuse into the bulk layer so as to increase the B doping concentration of the bulk layer;

Step 2.4, performing a thermal oxidation process, wherein the thermal oxidation process oxidizes the second cap layer and the first cap layer, wherein the bulk layer is not oxidized or only its top is oxidized, wherein the oxidized first cap layer, the oxidized second cap layer, and the oxidized top of the bulk layer, constitute a resultant top oxide layer, wherein the resultant top oxide layer comprises $SiO_2$, wherein the thermal oxidation process diffuses the B impurities from the first cap layer into the bulk layer, the seed layer, and the top semiconductor substrate, so as to increase B doping concentrations in the bulk layer, the seed layer, and the top semiconductor substrate, thereby reducing a source-drain electric resistance, wherein the B impurities are confined below the resultant top oxide layer and above the buried insulating dielectric layer;

Step 2.5, removing the resultant top oxide layer; and

Step 2.6, performing an epitaxial growth to form a third cap layer on the surface of the bulk layer, wherein the third cap layer is a B-doped Si epitaxial layer, and stacking the seed layer, the bulk layer, and the third cap layer to form the elevated source-drain structure.

2. The method for making the elevated source-drain structure of the PMOS in the FDSOI process according to claim 1, wherein, if the top of the bulk layer is oxidized in Step 2.4, then Step 2.2 further comprises increasing by an additional thickness on the bulk layer to compensate a depleted thickness due to oxidation on its top.

3. The method for making the elevated source-drain structure of the PMOS in the FDSOI process according to claim 2, wherein, in Step 2.4, the thermal oxidation process diffuses B impurities and Ge impurities from the oxidized top of the bulk layer to an unoxidized region of the bulk layer at the bottom, the seed layer, and the top semiconductor substrate, to increase the B doping concentration and the Ge doping concentration in the unoxidized region of the bulk layer, the seed layer, and the top semiconductor substrate.

4. The method for making the elevated source-drain structure of the PMOS in the FDSOI process according to claim 1, wherein, in Step 2, the Ge concentration of the epitaxial growth of the bulk layer is configured to be within a range of 20% to 45%.

5. The method for making the elevated source-drain structure of the PMOS in the FDSOI process according to claim 1, wherein the first cap layer has a thickness in a range of 100 Å-200 Å and the B doping concentration is in a range of $2e^{20}cm^{-3}$-$1e^{21}cm^{-3}$.

6. The method for making the elevated source-drain structure of the PMOS in the FDSOI process according to claim 1, wherein the second cap layer has a thickness in a range of 100 Å-200 Å.

7. The method for making the elevated source-drain structure of the PMOS in the FDSOI process according to claim 1, wherein the third cap layer has a thickness in a range of 100 Å-200 Å and a B doping concentration of the third cap layer is in a range of $2e^{20}cm^{-3}$-$1e^{21}cm^{-3}$.

8. The method for making the elevated source-drain structure of the PMOS in the FDSOI process according to claim 1, wherein, in Step 2.1, the seed layer is a B—Ge-doped Si epitaxial layer, the seed layer has a B doping concentration lower than a B doping concentration of the bulk layer, wherein the seed layer has a Ge doping concentration that is lower than the Ge doping concentration of the bulk layer, and wherein the seed layer reduces defects from a lattice mismatch between the top semiconductor substrate and the bulk layer.

9. The method for making the elevated source-drain structure of the PMOS in the FDSOI process according to claim 1, wherein, in Step 2.2, during the performing the epitaxial growth to form the bulk layer, a Ge source gas includes $GeH_4$ and a B source gas includes $B_2H_6$, wherein increasing a flow rate of $GeH_4$ limits a reaction between $B_2H_6$ and the top semiconductor substrate, thereby inhibiting an increase of the B doping concentration.

10. The method for making the elevated source-drain structure of the PMOS in the FDSOI process according to claim 1, wherein, in Step 1, the bottom semiconductor substrate comprises silicon, the buried insulating dielectric layer comprises silicon dioxide, and the top semiconductor substrate comprises silicon.

11. The method for making the elevated source-drain structure of the PMOS in the FDSOI process according to claim 1, wherein, in Step 2.4, the thermal oxidation process comprises dry-oxygen oxidation.

12. The method for making the elevated source-drain structure of the PMOS in the FDSOI process according to claim 1, wherein, in Step 2.5, a SiCoNi cleaning process is performed to remove the resultant top oxide layer.

13. The method for making the elevated source-drain structure of the PMOS in the FDSOI process according to claim 1, further comprising: forming a metal silicide on a surface of the third cap layer.

14. The method for making the elevated source-drain structure of the PMOS in the FDSOI process according to claim 13, wherein the metal silicide comprises NiSi.

15. The method for making the elevated source-drain structure of the PMOS in the FDSOI process according to claim 1, wherein, in Step 1, the gate structure comprises a gate dielectric layer, a gate conductive material layer, and sidewalls formed at sides of the gate structure.

* * * * *